United States Patent [19]
Ichikawa et al.

[11] Patent Number: 4,776,040
[45] Date of Patent: Oct. 4, 1988

[54] SUPERHETERODYNE RECEIVER

[75] Inventors: Toshihito Ichikawa; Hideki Iwasaki, both of Saitama, Japan

[73] Assignee: Pioneer Electronic Corporation, Tokyo, Japan

[21] Appl. No.: 85,268

[22] Filed: Aug. 12, 1987

Related U.S. Application Data

[63] Continuation of Ser. No. 772,212, Sep. 3, 1985, abandoned.

[30] Foreign Application Priority Data

Sep. 3, 1984 [JP] Japan .......................... 59-133856[U]

[51] Int. Cl.⁴ .............................................. H04B 1/26
[52] U.S. Cl. .................................. 455/315; 455/234; 455/239; 455/240; 455/247
[58] Field of Search ............... 455/234, 239, 240, 243, 455/246, 247, 249, 250, 315

[56] References Cited

U.S. PATENT DOCUMENTS

| | | | |
|---|---|---|---|
| 2,112,279 | 3/1938 | Hagenhaus | 455/247 |
| 3,895,299 | 7/1975 | Tiedeman, Jr. | 455/249 |
| 4,520,507 | 5/1985 | Moon | 455/315 |
| 4,580,288 | 4/1986 | Rinderle | 455/247 |

Primary Examiner—Michael A. Masinick
Attorney, Agent, or Firm—Sughrue, Mion, Zinn, Macpeak & Seas

[57] ABSTRACT

A superheterodyne receiver in which unwanted lowering of the RF gain due to the presence of an interference signal outside the band of the desired signal is substantially eliminated. Levels of the outputs of both the RF amplifier and first mixer of the circuit are detected. The two level detection signals so produced are summed, and the sum signal applied to the gain control input terminal of the RF amplifier.

4 Claims, 3 Drawing Sheets

SUPERHETERODYNE RECEIVER

This is a continuation of application Ser. No. 772,212 filed Sept. 3, 1985, abandoned.

BACKGROUND OF THE INVENTION

The present invention relates to a superheterodyne receiver.

FIG. 1 shows in block diagram form a conventional superheterodyne receiver. In such a superheterodyne receiver, a received RF signal is supplied to a first mixer 2 through an aperiodic RF amplifier 1 and mixed with the output of a variable-frequency local oscillator 3. A second mixer 5 is connected to the first mixer 2 through a BPF (Band Pass Filter) 4. The RF signal at the output of the BPF 4 is mixed with the output of a fixed-frequency local oscillator 6 and thus converted to an IF (Intermediate-Frequency) signal. An IF amplifier and detector 8 are connected to the second mixer 5 through a BPF 7, whereby a low-frequency (baseband) output is obtained at the output of the IF amplifier and detector 8. An AGC (Auto Gain Control) amplifier 9, connected to the output of the IF amplifier and detector 8 and provided with an AGC voltage corresponding to the output level of the IF amplifier and detector 8, supplies an AGC voltage to the IF gain control input terminal of the IF amplifier and detector 8. A level detecting circuit 10 is connected to the output of the RF amplifier 1 so as to obtain a level control voltage corresponding to the RF output level of the RF amplifier 1, which level control voltage is supplied to the gain control input terminal of the RF amplifier 1.

In the receiver thus constructed, the RF signal received from an antenna 13 is amplified by the RF amplifier 1. As shown in FIG. 2, the level detecting circuit 10 has a flat characteristic. Consequently, the amplification factor of the RF amplifier 1 is controlled directly by the output signal level of the RF amplifier 1, specifically, the amplification factor is controlled so that the higher the output RF signal level of the RF amplifier 1, the smaller the amplification factor of the RF amplifier 1. The output RF signal of the RF amplifier 1 is subjected to frequency conversion. Namely, the output RF signal of the mixer 2, which is at a first intermediate frequency $f_1$ higher than the receiving RF band, is filtered by the BPF 4. The output of the BPF 4 is supplied to the mixer 5 for conversion to a second intermediate frequency lower than the first intermediate frequency. The output RF signal of the mixer 5 is filtered by the BPF 7 before being supplied to the IF amplifier and detector 8, whereby a detected signal is produced by the IF amplifier and detector 8. The AGC voltage corresponding to the output signal level of the IF amplifier and detector 8 is applied from the AGC amplifier 9 to the IF amplifier and detector 8, whereby the IF amplification factor is controlled.

In this conventional superheterodyne receiver, because the RF amplifier 1 is aperiodic and has a flat amplification characteristic in the receiving band, the tuning frequency is determined by the mixer 2, the variable-frequency local oscillator 3 and the BPF 4. However, if an interference signal sufficiently stronger than the desired signal is present in a frequency range other than the tuning frequency range in the receiving band, the gain of the RF amplifier will be controlled by the level detecting circuit according to that strong interference signal. Consequently, the receiving sensitivity is suppressed, making reception difficult.

SUMMARY OF THE INVENTION

Thus, it is an object of the present invention to provide a superheterodyne receiver having an aperiodic RF amplifier in the preceding stage of a mixer with which a desired signal can be received and amplified without the difficulty of an interference signal stronger than a desired RF signal causing suppression of the receiving gain for the desired signal.

In accordance with this and other objects, a superheterodyne receiver according to the present invention is provided comprising first level detecting means for producing a first detection signal depending on the output signal level of an aperiodic RF amplifier; second level detecting means for producing a second detection signal having a level determined by the RF signal level of a predetermined intermediate frequency signal produced by mixer means; and adder means for controlling the gain of the RF amplifier with a signal obtained by summing the first and second detection signals.

DESCRIPTION OF THE PREFERRED EMBODIMENTS

Referring to FIGS. 3 through 6, a preferred embodiment of the present invention will be described.

Figure 1:
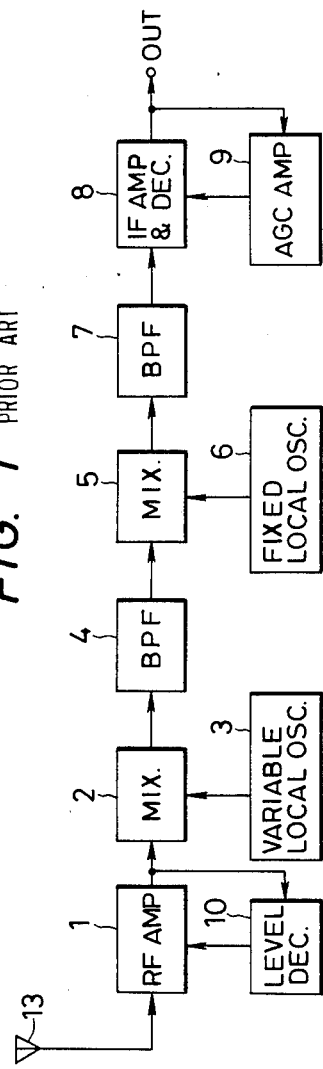
FIG. 1 is a block diagram of a conventional superheterodyne receiver.
Figure 2:
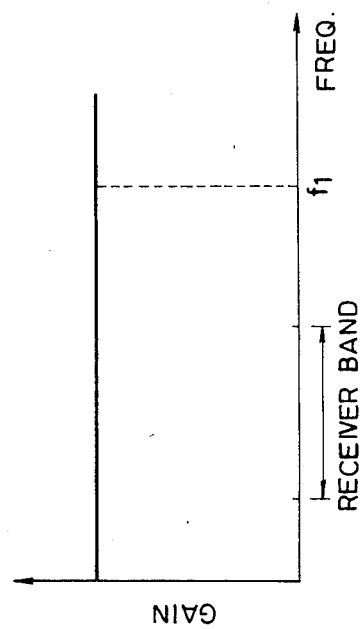
FIG. 2 is a graph illustrating the output characteristics of the level detecting circuit in the receiver of FIG. 1.
Figure 3:
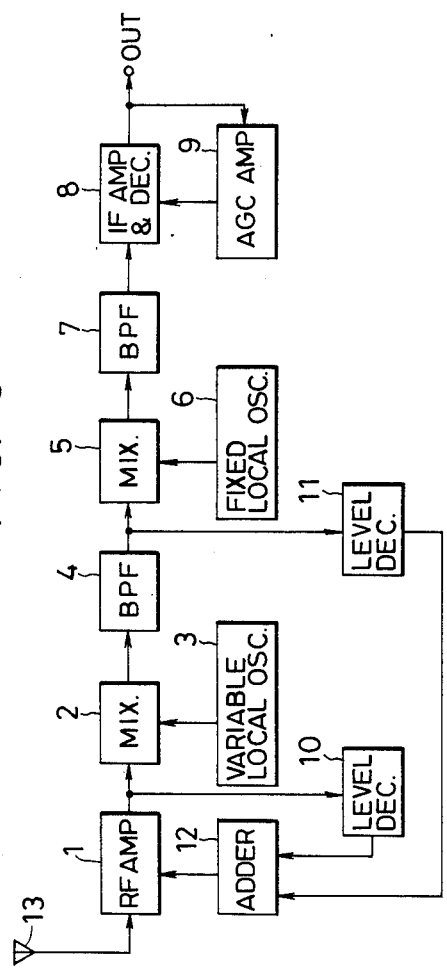
FIG. 3 is a block diagram of a preferred embodiment of a receiver of the present invention.

In the receiver embodying the present invention shown in FIG. 3, like reference numerals designate like elements in FIG. 1.

In FIG. 3, a mixer 5 and a level detecting circuit 11 are connected to the output of a BPF 4. The output levels of the level detecting circuits 10 and 11 are summed by an adder 12, and the sum signal is supplied to the gain control input terminal of an RF amplifier 1. Except for the aforementioned, the receiver according to the present invention is constructed in the same manner as that shown in FIG. 1.

In the receiver thus constructed, according to the present invention, since the output RF signal of the BPF 4 is a signal whose center frequency has been changed to a first intermediate frequency, the level of only this signal is detected by the level detecting circuit 11. On the other hand, the level detecting circuit 10 detects the output level of the RF amplifier 1 in the same manner as in the connectional circuit. The levels detected by the level detecting circuits 10 and 11 are summed by an adder 12, and the sum signal supplied to the gain control input terminal of the RF amplifier 1.

Assuming a gain $G_1$ of the RF amplifier, a conversion gain $G_2$ of the mixer 2, gains $G_{10}$ and $G_{11}$ of the level detecting circuits 10 and 11, and a center-frequency gain $G_4$ of the BPF 4, the relation between these gains can be expressed by:

$$g_1 = G_1 + G_{10} < G_1 + G_2 + G_4 + G_{11} = g_2$$

Figure 4:
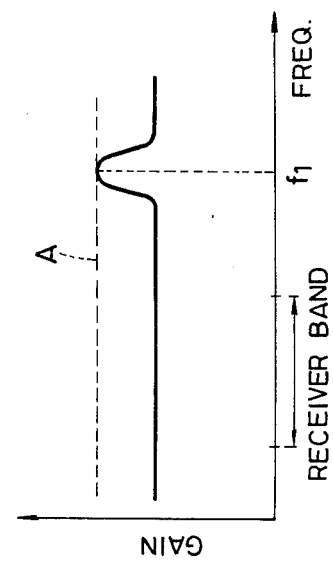
FIG. 4 is a graph illustrating the output characteristics of an adder in the receiver of FIG. 3.

Accordingly, the adder 12 has a generally flat output frequency characteristic but with a peak at a first intermediate frequency $f_1$, as shown in FIG. 4. Assuming the gains of the level detecting circuits are equal ($G_{10} = G_{11}$), the peak value will be determined by $G_2 + G_4$. In other words, the level of the RF signal inputted to the RF amplifier 1 changes with the signal strength, provided that the signal is present in the tuning frequency range. Even if a high-intensity field signal is present in the received frequency band corresponding to the flat portion above, it will have no effect on the gain control of the RF amplifier (unless its strength reaches the level shown by a broken line of FIG. 4).

Figure 5:
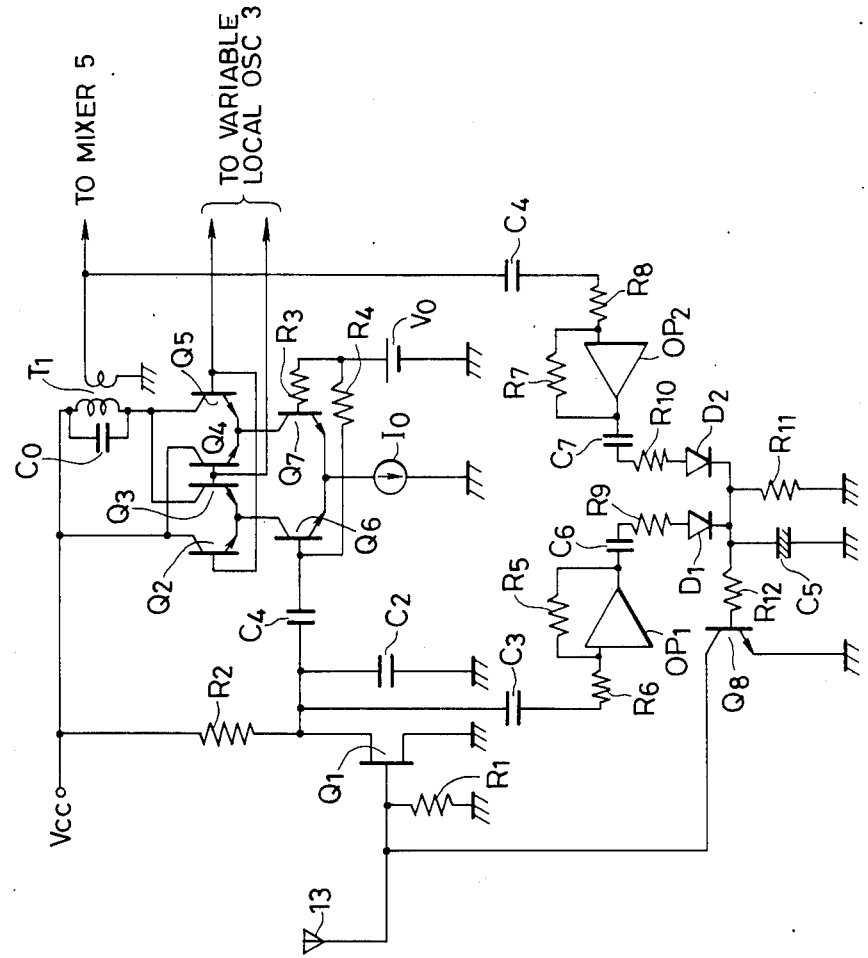
FIG. 5 is a circuit diagram illustrating the principal portions of the receiver of FIG. 3.

FIG. 5 shows principal portions of the receiver according to the present invention of FIG. 3 in more detail. In FIG. 5, a field effect transistor $Q_1$ and a resistor $R_2$ form the RF amplifier 1. The RF signal is supplied from an antenna 13 to the gate of the transistor $Q_1$. The resistor $R_1$ and a capacitor $C_1$ act as a bias resistor and a bias capacitor. Further, a resistor $R_2$ and a capacitor $C_2$ form a low-pass filter used to stabilize the first intermediate frequency. Transistors $Q_2$ through $Q_7$, bias resistors $R_3$ and $R_4$, a constant-current regulated power source $I_0$, and a bias power supply $V_0$ constitute a double balanced mixer 2, the output of which is provided to the BPF 4, here composed of a transformer $T_1$ and a capacitor $C_0$. Capacitors $C_3$ and $C_6$, resistors $R_6$ and $R_9$, an operational amplifier $OP_1$, and a diode $D_1$ constitute the level detecting circuit 10. The output signal of the RF amplifier 1 is amplified by an amplifier formed by the resistors $R_5$ and $R_6$ and the operational amplifier $OP_1$, the amplified output of which is rectified by the resistor $R_9$ and the diode $D_1$. Similar to the level detecting circuit 10, the level detecting circuit 11 is constituted by capacitors $C_4$ and $C_7$, resistors $R_7$, $R_8$, and $R_{10}$, an operational amplifier $OP_2$, and a diode $D_2$. Resistors $R_{11}$ and $R_{12}$, the capacitor $C_5$, and a transistor $Q_8$ constitute the adder 12. The sum of the output voltages of the level detecting circuits 10 and 11 is averaged by the capacitor $C_5$ and supplied to the base of the transistor $Q_8$. A portion of the current of the RF signal from the antenna 13 is caused to flow to ground through the transistor $Q_8$ in an amount determined by the terminal voltage of the capacitor $C_5$ to control the gain of the RF amplifier 1.

Although a double balanced mixer is employed as the mixer 2 in the receiver of FIG. 3, a single balanced mixer can be used as well. Moreover, the first intermediate frequency output may be obtained through a ceramic filter after tuning by means of a coil.

In the superheterodyne receiver according to the present invention, both the output level of the aperiodic RF amplifier and the intermediate-frequency output level of the mixer are detected and the resulting detection signals summed to control the gain of the RF amplifier. Since the gains of the detectors are slightly different from each other (as shown by the equation above), the gain of the RF amplifier is controlled according to the RF tuning signal level of the tuning frequency. Thus, the desired signal can be received without attenuation when a strong interference signal is present at a frequency other than within the tuned receiving bandwidth, provided that the difference in the signal level is within the range of $g_2 - g_1$. Moreover, because the gain of the RF amplifier is controlled depending on the interference signal, even if the interference signal becomes so strong as to exceed the range of $g_2 - g_1$, interference due to cross modulation is reduced.

We claim:

1. A double superheterodyne receiver comprising: an aperiodic RF amplifier having a gain control input and including a field-effect transistor receiving an RF signal at its gate; a variable-frequency local oscillator; first mixing means having a first input coupled to an output of said aperiodic RF amplifier and a second input coupled to an output of said variable-frequency local oscillator; first level detecting means having an input coupled to an output of said first mixing means; first bandpass filter means coupled in series with said first mixing means, said output of said first mixing means being provided at an input terminal of said first bandpass filter means; second level detecting means having an input coupled to said output of said aperiodic RF amplifier; a summing circuit having a first input coupled to an output of said first level detecting means and a second input coupled to an output of said second level detecting means, an output of said summing circuit being coupled to said gain control input of said aperiodic RF amplifier; a fixed local oscillator; second mixing means having a first input coupled to an output of said fixed local oscillator and a second input coupled to said output of said first mixing means; a second bandpass filter having an input coupled to an output of said second mixing means; an IF amplifier and detector having an input coupled to an output of said second mixing means; and an AGC amplifier, coupled to an output of said IF amplifier and detector for controlling an amplification factor of said IF amplifier and detector.

2. The double superheterodyne receiver of claim 1, wherein, for a gain $G_1$ of said aperiodic RF amplifier, a gain $G_2$ of said first mixing means, a gain $G_{11}$ of said first level detecting means, and a gain $G_{10}$ of said second level detecting means:

$$G_1 + G_{10} < G_1 + G_2 + G_4 + G_{11}.$$

3. The double superheterodyne receiver of claim 2, wherein $G_{10} = G_{11}$.

4. The double superheterodyne receiver of claim 2, wherein said first mixing means comprises a double balanced mixer.

* * * * *